United States Patent
Fischer

(10) Patent No.: US 9,123,727 B2
(45) Date of Patent: Sep. 1, 2015

(54) AIRGAP INTERCONNECT WITH HOOD LAYER AND METHOD OF FORMING

(75) Inventor: Kevin Fischer, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/997,171

(22) PCT Filed: Dec. 29, 2011

(86) PCT No.: PCT/US2011/067906
§ 371 (c)(1),
(2), (4) Date: Jun. 21, 2013

(87) PCT Pub. No.: WO2013/101096
PCT Pub. Date: Jul. 4, 2013

(65) Prior Publication Data
US 2014/0191401 A1 Jul. 10, 2014

(51) Int. Cl.
*H01L 21/70* (2006.01)
*H01L 23/532* (2006.01)
*H01L 21/764* (2006.01)
(Continued)

(52) U.S. Cl.
CPC ........ *H01L 23/53238* (2013.01); *H01L 21/764* (2013.01); *H01L 21/7682* (2013.01); *H01L 21/7685* (2013.01); *H01L 21/76834* (2013.01); *H01L 21/76852* (2013.01); *H01L 23/5222* (2013.01); *H01L 23/53295* (2013.01); *H01L 2924/0002* (2013.01)

(58) Field of Classification Search
CPC .................................................. H01L 21/764

USPC .......................................... 257/522; 438/411
See application file for complete search history.

(56) References Cited

U.S. PATENT DOCUMENTS

| 5,670,420 | A | 9/1997 | Choi | |
|---|---|---|---|---|
| 7,205,233 | B2 * | 4/2007 | Lopatin et al. | 438/678 |
| 7,566,656 | B2 * | 7/2009 | Liu et al. | 438/667 |

(Continued)

FOREIGN PATENT DOCUMENTS

| JP | 2001-053144 A | 2/2001 |
|---|---|---|
| TW | 200414414 A | 8/2004 |

OTHER PUBLICATIONS

International Search Report mailed Sep. 19, 2012 for PCT/US2011/067906, filed Dec. 29, 2011, 3 pages.

(Continued)

*Primary Examiner* — Nicholas Tobergte
(74) *Attorney, Agent, or Firm* — Blakely, Sokoloff, Taylor & Zafman LLP

(57) ABSTRACT

An airgap interconnect structure with hood layer and methods for forming such an airgap interconnect structure are disclosed. A substrate having a dielectric layer with a plurality of interconnects formed therein is provided. Each interconnect is encapsulated by a barrier layer. A hardmask is formed on the dielectric layer and patterned to expose the dielectric layer between adjacent interconnects where an airgap is desired. The dielectric layer is etched to form a trench, wherein the etching process additionally etches at least a portion of the barrier layer to expose a portion of the side surface of each adjacent copper interconnect. A hood layer is electrolessly plated onto an exposed portion of the top surface and the exposed portion of the side surface to reseal the interconnect. A gap-sealing dielectric layer is formed over the device, sealing the trench to form an airgap.

19 Claims, 9 Drawing Sheets

(51) Int. Cl.
   *H01L 23/522*   (2006.01)
   *H01L 21/768*   (2006.01)

(56) References Cited

U.S. PATENT DOCUMENTS

| | | | |
|---|---|---|---|
| 7,772,702 B2* | 8/2010 | Bielefeld et al. | 257/758 |
| 7,879,683 B2* | 2/2011 | Al-Bayati et al. | 438/422 |
| 8,283,248 B2* | 10/2012 | Kim et al. | 438/619 |
| 2004/0119134 A1 | 6/2004 | Goldberg et al. | |
| 2007/0246831 A1* | 10/2007 | Gabric et al. | 257/758 |
| 2009/0093100 A1* | 4/2009 | Xia et al. | 438/421 |
| 2010/0130001 A1 | 5/2010 | Noguchi | |
| 2011/0291281 A1* | 12/2011 | Huang et al. | 257/762 |

OTHER PUBLICATIONS

Written Primary Examination Decision of Rejection from the Intellectual Property Office dated Mar. 9, 2015, Taiwan Patent Application No. 101148336 and English Translation thereof.

Office Action in Primary Examination (8 pages) dated Nov. 12, 2014, Taiwan Patent Application No. 101148336 and English Translation thereof (10 pages).

* cited by examiner

AIRGAP INTERCONNECT WITH HOOD LAYER AND METHOD OF FORMING

CROSS-REFERENCE TO RELATED APPLICATION

This patent application is a U.S. National Phase Application under 35 U.S.C. §371 of International Application No. PCT/US2011/067906, filed Dec. 29, 2011, entitled AIRGAP INTERCONNECT WITH HOOD LAYER AND METHOD OF FORMING.

FIELD OF THE INVENTION

The present invention relates generally to the manufacture of semiconductor devices. In particular, embodiments of the present invention relate to airgap interconnects with a hood layer that prevents diffusion and electromigration of the interconnect material to increase interconnect reliability.

BACKGROUND AND RELATED ARTS

As microprocessors become faster and smaller, integrated circuitry (IC) becomes more complex and components become more densely packed. IC components are connected by conductive traces and vias (collectively referred to as "interconnects") though which electrical signals are sent and/or received. Interconnects are typically formed through a damascene process, whereby conductive material is deposited into holes and trenches etched into a semiconductor substrate. The surrounding material electrically insulates each interconnect from neighboring interconnects. However, the dielectric properties of the substrate material enable capacitive coupling between adjacent interconnects, which increases chip power requirements and interferes with signal transmission.

As device dimensions decrease, interconnect dimensions and spacing also decrease, which results in increased current density and resistance along with a greater risk of electromigration, capacitive coupling and RC delay. Furthermore, interconnect material may diffuse into the surrounding dielectric material, reducing the dielectric insulating capacity and enabling crosstalk between adjacent interconnects and components. While diffusion and electromigration may be controlled by encapsulating the interconnect with a barrier layer, the additional barrier material may increase the resistance and dimensions of the interconnect.

Recent innovations address capacitive coupling by incorporating an airgap between neighboring interconnects. Air has an extremely low dielectric constant (about 1, compared to about 4 for silicon dioxide), and therefore more effectively isolates adjacent interconnects than solid dielectric materials.

DETAILED DESCRIPTION

An airgap interconnect structure with a hood layer for use in an integrated circuit and a process for forming such airgap interconnects with hood layer are described. Embodiments of the present invention have been described with respect to specific details in order to provide a thorough understanding of the invention. One of ordinary skill in the art will appreciate that the invention can be practiced without these specific details. In other instances, well known semiconductor processes and equipment have not been described in specific detail in order to not unnecessarily obscure the present invention. Additionally, the various embodiments shown in the figures are illustrative representations and are not necessarily drawn to scale.

An airgap interconnect structure with a hood layer and methods for forming such airgap interconnects with hood layers are disclosed herein. Interconnect surfaces must be sealed by one or more barrier layers to prevent diffusion of the interconnect material into adjoining dielectric and device layers, to prevent electromigration of the interconnect material due to current flow, and to prevent oxidation of the interconnect material, all of which can lead to device failure. In addition, airgaps are used to reduce capacitive coupling between adjacent interconnects by replacing dielectric material (k=~4) with air, which has a very low dielectric constant (k=~1). To form an airgap, a hardmask is patterned to expose the dielectric surface between adjacent interconnects, and the dielectric material is etched away to create a trench. The etching process may also remove portions of the barrier layer, exposing the interconnect surface. To reseal the interconnect after etching, a hood layer is selectively deposited on exposed surfaces of the interconnect. The hood layer covers a portion of the top surface of the interconnect and a portion of the side surface of the interconnect adjacent to the trench, and improves device reliability by preventing diffusion, electromigration, and oxidation. A gap-sealing dielectric layer is blanket deposited over the entire interconnect structure, pinching off above the trench, in order to seal the trench to form an airgap.

Another embodiment of the invention further comprises a conformal liner layer, which provides additional protection against diffusion of interconnect material into surrounding dielectric material by sealing the interfaces of the hardmask/hood layer and hood layer/barrier layer. The conformal liner layer is non-selectively and conformally deposited over the hardmask, hood layer, and other surfaces defining the interior of the trench. In embodiments where the trench exposes a portion of the barrier layer on an interconnect, the conformal liner layer covers the barrier layer surface to prevent oxidation. The additional conformal liner layer may further improve reliability of the airgap interconnects.

Figure 1A:
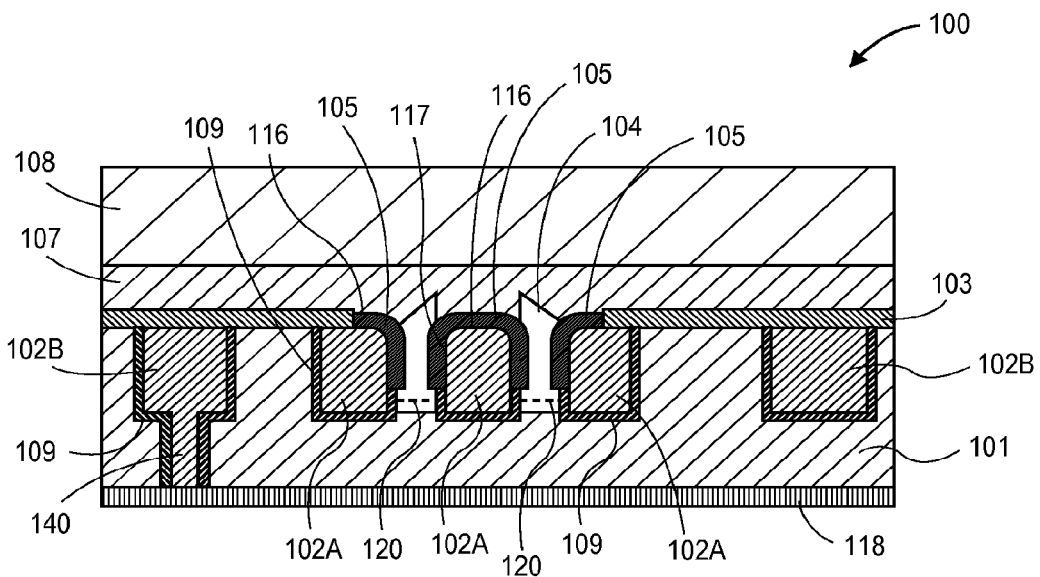
FIG. 1A illustrates a cross-sectional view of a hood layer on airgap interconnects, according to an embodiment of the invention.
Figure 1B:
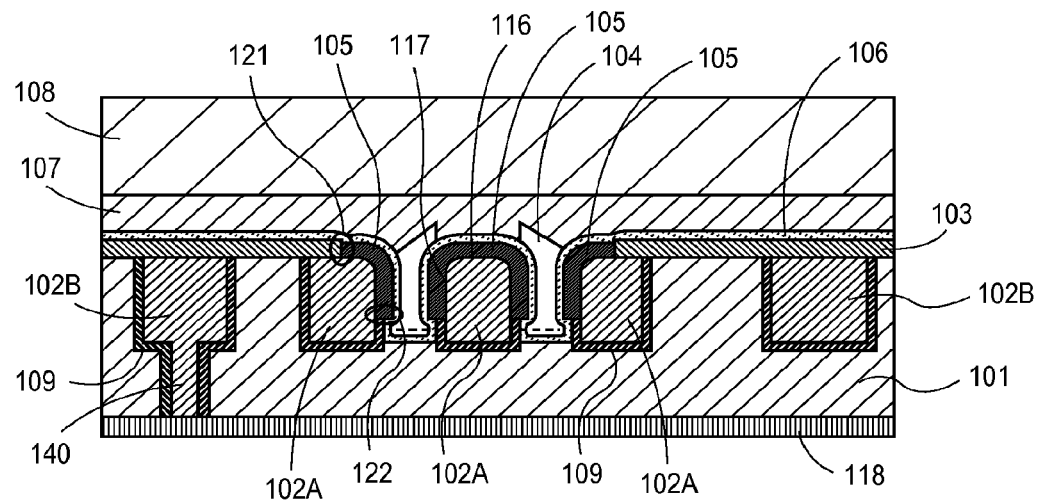
FIG. 1B illustrates a cross-sectional view of a conformal liner layer and hood layer on airgap interconnects, according to an embodiment of the invention.

FIGS. 1A-1B illustrate an airgap interconnect structure on a substrate in accordance with an embodiment of the invention. The airgap interconnects may be part of a structure containing multiple levels of devices used to form an integrated circuit. The airgap interconnects are used to connect active and passive devices throughout the different levels of the integrated circuit. It is understood that the integrated circuit comprising the airgap interconnect structure will further comprise additional layers above or below the layer containing the airgap interconnect structure. However, for the purposes of discussion only the airgap interconnect structure is illustrated in the figures.

An airgap interconnect structure 100 is shown in FIG. 1A, wherein airgaps 104 are disposed between adjacent interconnects 102A in order to reduce the capacitive coupling experienced by the interconnects, according to an embodiment of the invention. In an embodiment, a portion of a top surface 116 and a side surface 117 of interconnects 102A are covered by a hood layer 105, in order to prevent diffusion of interconnect material into surrounding dielectric materials, prevent electromigration of interconnect material, and prevent oxidation of the interconnect surface. Some interconnects 102 have vias, such as via 140, connecting to lower layers of the integrated circuit. Interconnects 102B are spaced far enough from adjacent interconnects that such interconnects would not benefit greatly from separation by an airgap. Airgap interconnect structure 100 further comprises a dielectric 101, in which interconnects 102 are formed, supported by a substrate 118. Additional metallic layers may be formed on substrate 118 either above or below dielectric 101.

Interconnects 102A are encapsulated by a hood layer 105, a barrier layer 109, and a hardmask 103 in order to prevent diffusion of interconnect material into adjoining materials and elements, to prevent electromigration of interconnect material, and to prevent oxidation of the interconnect surface. Hardmask 103 covers portions of the top surface of dielectric 101 and the top surface 116 of interconnect 102A. In an embodiment, hood layer 105 is formed on the interconnect surface that is exposed between hardmask 103 and barrier layer 109. In an embodiment, hood layer 105 covers a portion of two surfaces of an interconnect 102A, for example, top surface 116 and side surface 117. In another embodiment, hood layer 105 covers a portion of three surfaces of an interconnect 102A, such as two side surfaces 117 and top surface 116. In an embodiment, hood layer 105 provides all the required protection against diffusion and electromigration of interconnect material for the surfaces on which the hood layer 105 is formed.

In an embodiment, hood layer 105 has been selectively formed on the exposed surfaces of interconnect 102A to improve reliability of the interconnect. Hood layer 105 may be any material capable of being electrolessly plated. Hood layer 105 may also be any material capable of preventing the diffusion, electromigration, and/or oxidation of material in interconnect 102A. In an embodiment of the invention, hood layer 105 is cobalt or a cobalt alloy, such as, but not limited to, cobalt tungsten alloy, cobalt tungsten phosphide, or cobalt boron phosphide. Hood layer 105 is of a uniform thickness sufficient to prevent diffusion and electromigration of interconnect material, but thin enough to not unduly increase the capacitance of interconnects 102A. Hood layer may be generally less than 20 nm thick and more typically from 5-15 nm thick. In an embodiment, hood layer 105 is 10 nm thick.

Airgap 104 is located between adjacent interconnects 102A, which are closely-spaced and therefore benefit from separation by extremely low k material. Airgap 104 is filled with air, which has a low dielectric constant (k=~1) in order to reduce capacitive coupling between adjacent interconnects, according to an embodiment of the invention. In another embodiment, airgap 104 is filled with a gas having a dielectric constant of about 1.

In an embodiment, airgap 104 extends below the bottom surface of interconnects 102A, as shown in FIG. 1A. In another embodiment, airgap 104 extends to a depth 120 between interconnects 102A. Airgap 104 may be typically from 40 to 100 nm wide, and the depth of airgap 104 may range from 50 to 200 nm. Airgaps may be used with interconnects having pitches less than 160 nm.

In an embodiment of the invention, there is no dielectric material lining airgap 104. In a specific embodiment, barrier layer 103 and hood layer 105 are the only material layers between the interconnects from the airgap, as shown in FIG. 1A. In another specific embodiment, hood layer 105 is the only material separating the interconnects from the airgap.

In an embodiment, a gap-sealing dielectric layer 107 covers the top surfaces of dielectric 101, hardmask 103 and hood layer 105, and also defines and seals the top of airgap 104. Gap-sealing dielectric layer 107 may be any dielectric material capable of being non-conformally deposited, such as silicon oxides, carbon doped silicon oxides and porous carbon doped silicon oxides typically with a dielectric constant in the range of 2 to 4. In an embodiment, gap-sealing dielectric layer is used to form the next level of interconnects or devices.

In another embodiment, an additional bulk interlayer dielectric (ILD) 108 covers gap-sealing dielectric layer 107 to provide additional insulation between the interconnect layer shown and any upper or lower device layers. In an embodiment, bulk ILD 108 has a lower dielectric constant than gap-sealing dielectric layer 107. Bulk ILD 108 may be formed from any material suitable to mitigate cross-talk between subsequently formed device layers, such as, for example, low k materials including carbon-doped oxide, porous dielectrics, fluorine-doped oxide, and the like. Additionally, bulk ILD 108 may be used to form the next level of interconnects or devices.

FIG. 1B illustrates a cross-sectional view of another embodiment of the invention, wherein conformal liner layer 106 optionally further increases interconnect reliability by providing additional protection against diffusion and electromigration of the interconnect material. In an embodiment, conformal liner layer 106 forms a continuous seal over a hood layer/hardmask interface 121 and over a hood layer/barrier layer interface 122. In an embodiment, conformal liner layer 106 conforms to the surfaces of hardmask 103, hood layer 105, any portion of barrier layer 109 exposed in airgap 104, and any portion of dielectric 101 exposed between adjacent interconnects 102A. In an embodiment of the invention, conformal liner layer 106 is of a material and thickness sufficient to create a hermetic seal over hood layer/hardmask interface 121 or hood layer/barrier layer interface 122. In an embodiment, conformal liner layer 106 is the same material as hardmask 103. In another embodiment, conformal liner layer 106 is a different material than hardmask 103. Conformal liner layer 106 is SiNC in an embodiment. In another embodiment, conformal liner layer 106 is SiN or SiC or $Al_2O_3$. In an embodiment, conformal liner layer 106 is of a material and thickness sufficient to prevent oxidation of any portion of barrier layer 109 adjacent to airgap 104. Conformal liner layer 106 may be 2-12 nm thick. In an embodiment, conformal liner layer is 5 nm thick.

Figure 2A:
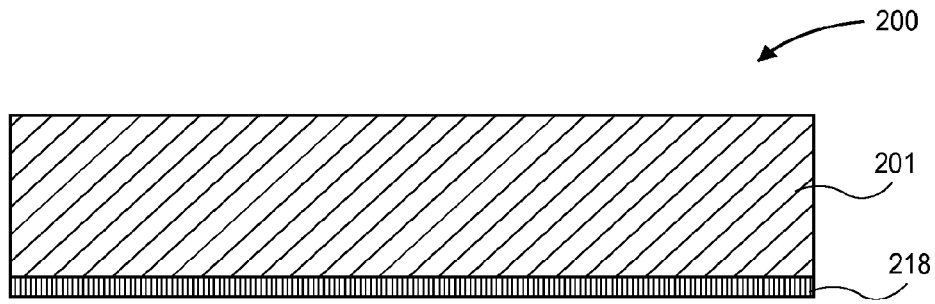
FIGS. 2A-2N illustrate a method for forming airgap interconnects with hood layers, according to an embodiment of the invention.
Figure 2B:
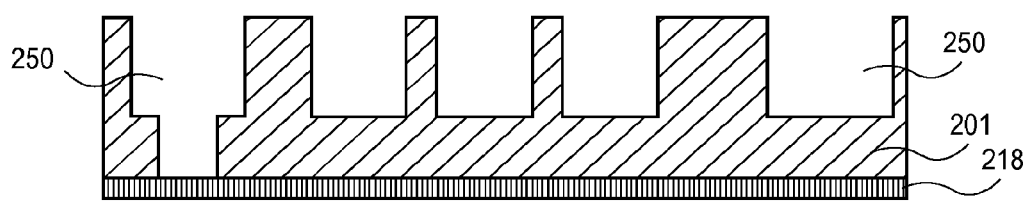
Figure 2C:
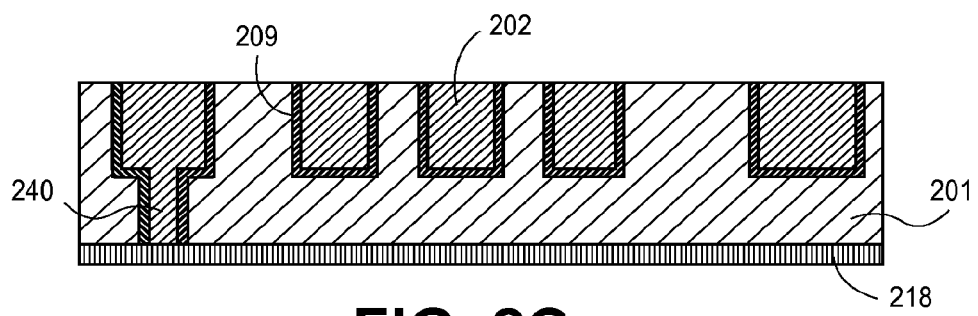
Figure 2D:
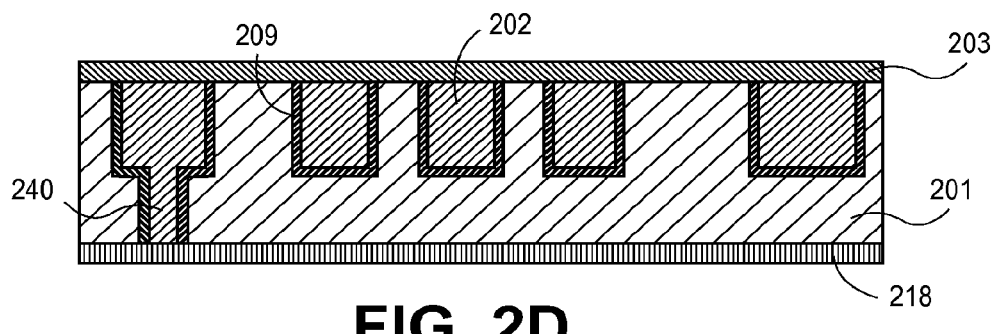
Figure 2E:
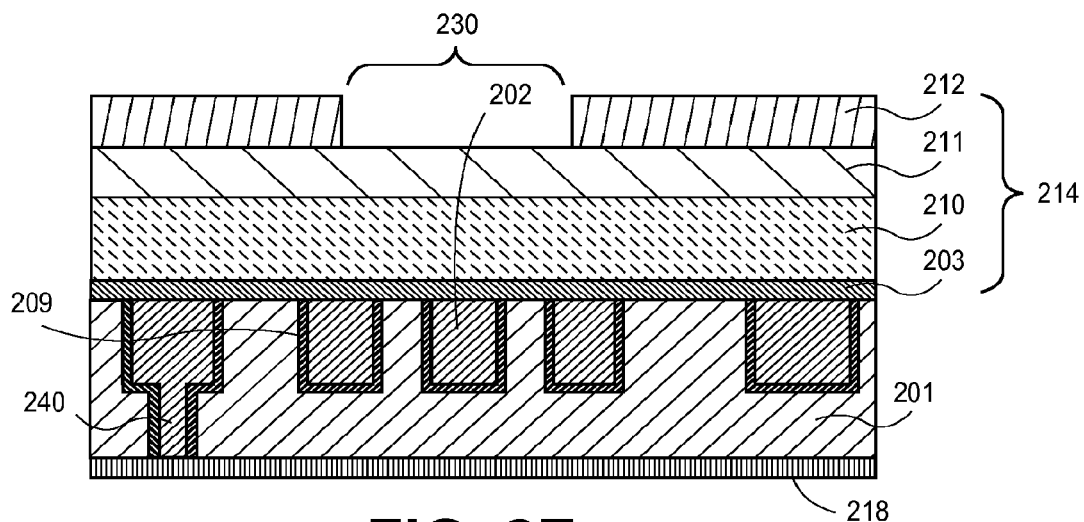
Figure 2F:
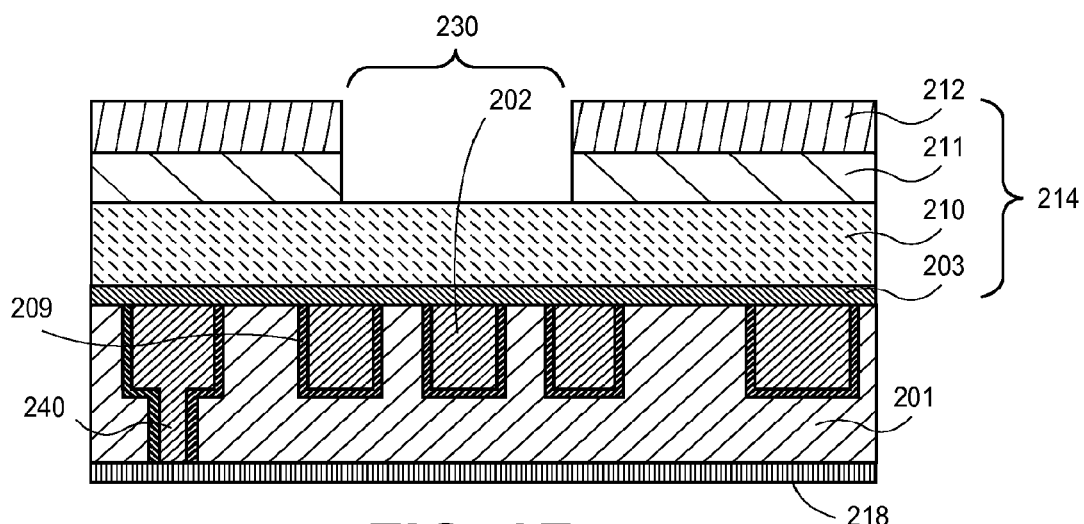
Figure 2G:
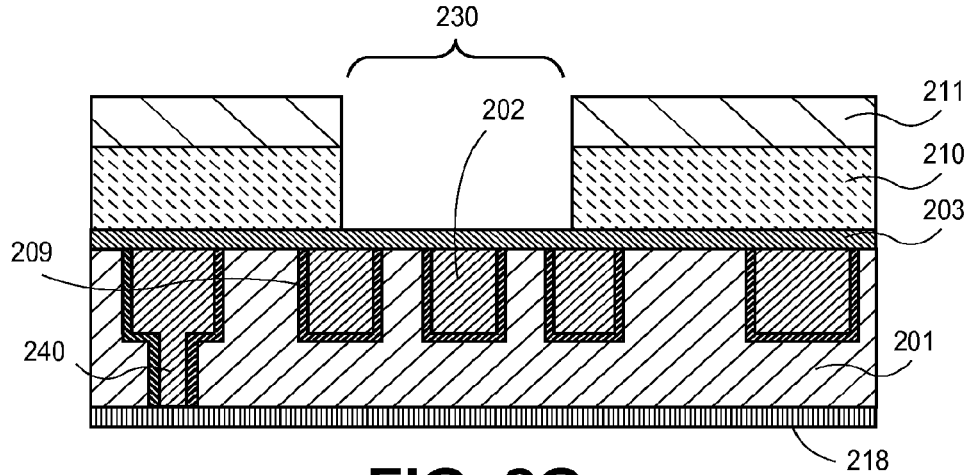
Figure 2H:
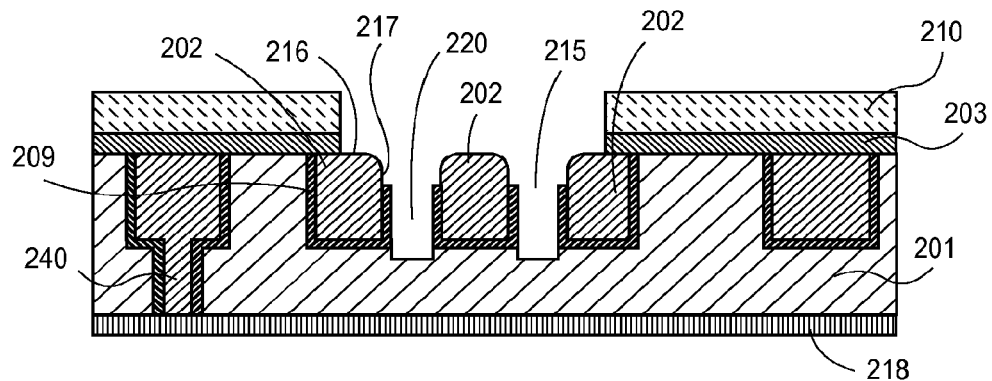
Figure 2I:
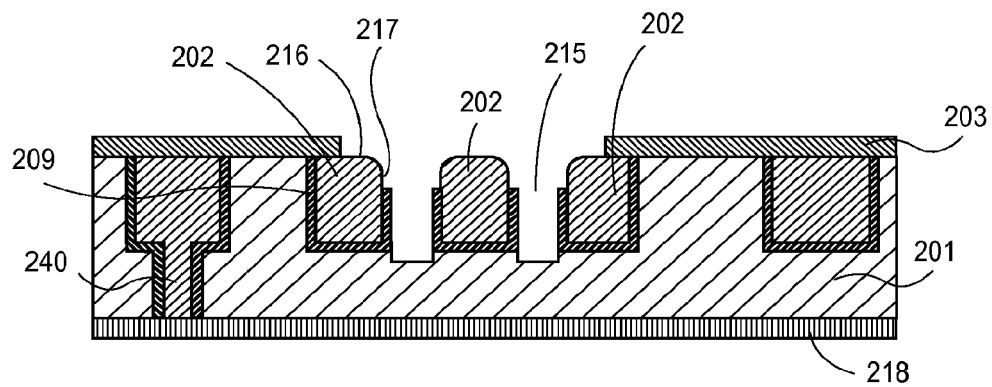
Figure 2J:
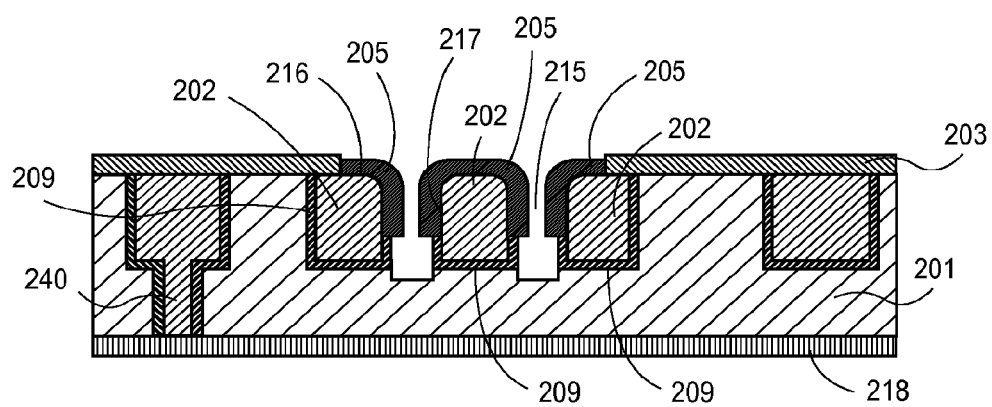
Figure 2K:
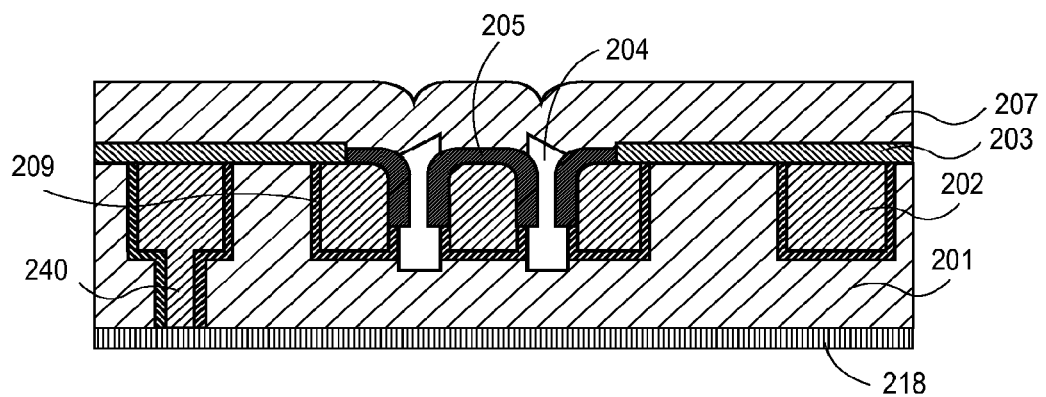
Figure 2L:
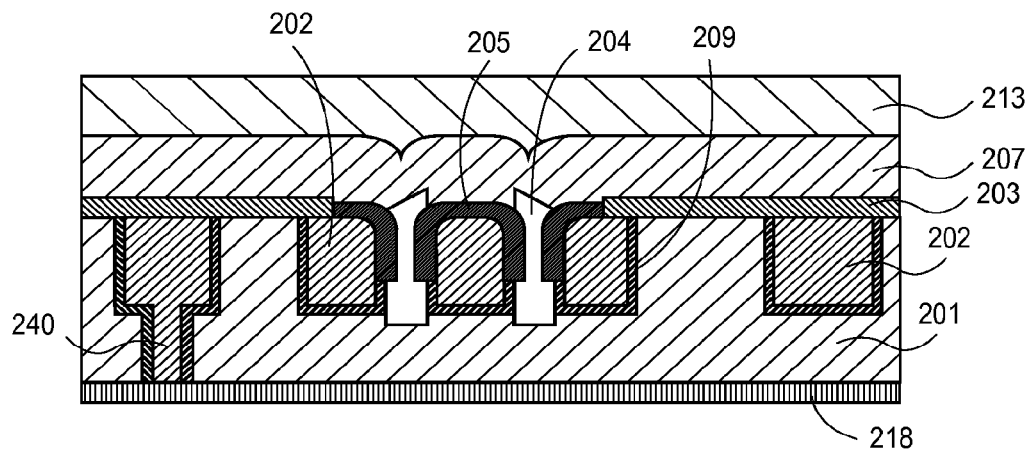
Figure 2M:
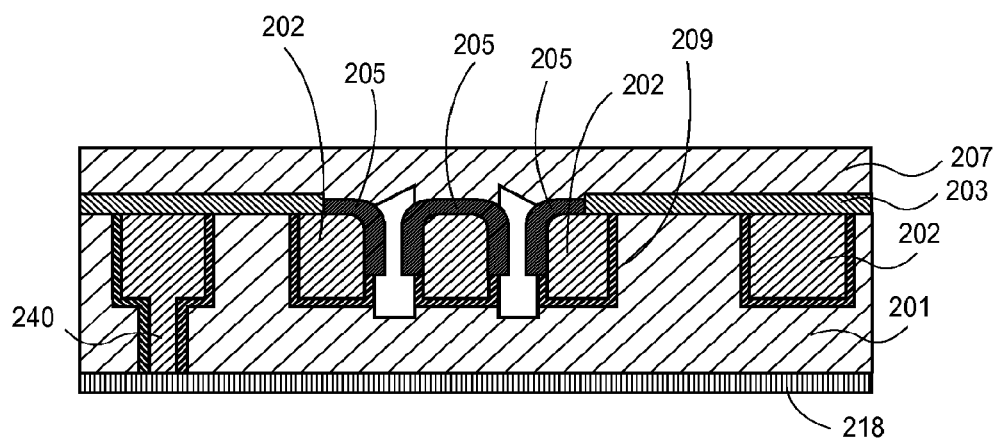
Figure 2N:
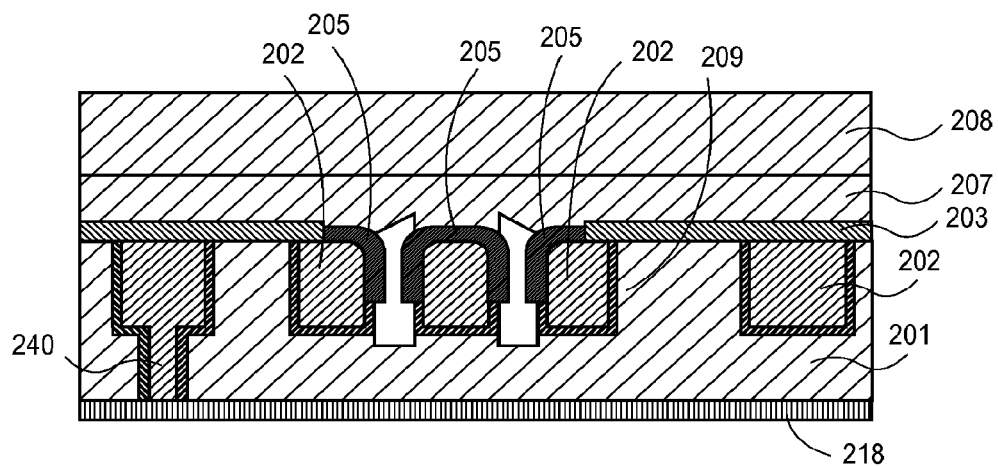

FIGS. 2A-2N illustrate an embodiment of a method for forming airgap interconnects with a hood layer. The airgap interconnect structure may be used in a multilevel interconnection structure or microelectromechanical system (MEMS) to electrically interconnect various active and passive devices such as transistors, capacitors, resistors, and inductors into functional circuits to form an integrated circuit. A hood layer formed on the interconnect surface improves reliability of the interconnect.

As shown in FIG. 2A, a substrate 200 is provided in which the airgap interconnects will be formed. The semiconductor structure may include a semiconductor substrate 218, such as, but not limited to, monocrystalline silicon, germanium, silicon germanium, and or group III-V compound semiconductors, such as GaAs and InP. Substrate 200 may also include any previously formed alternating layers of metallization and dielectric.

Substrate 200 also comprises dielectric 201, according to embodiments of the invention. Dielectric 201 can be any material that is suitable to act as a base for a plurality of airgap interconnects. In an embodiment of the invention, dielectric 201 is silicon dioxide. In alternative embodiments, dielectric 201 may comprise a low k dielectric material, such as a silicate, carbon doped oxide, fluorine doped oxide, porous dielectric materials, and the like. Interconnects may be formed in substrate 200 by any suitable process, such as a damascene, dual damascene, or subtractive approach.

In an embodiment, a damascene process is used to form interconnects 102, wherein a plurality of trenches 250 are etched and filled with a conductive material, as shown in FIGS. 2B-C. First, a plurality of trenches 250 are etched in dielectric 201, as shown in FIG. 2B, in the locations where interconnects are to be formed. Some trenches may have vias to connect to devices or layers below. Forming trenches in dielectric material is well-known in the semiconductor art, such as, for example, through a series of masking and etching processes.

Next, a barrier layer 209 is conformally deposited on the surfaces of trenches 250, as shown in FIG. 2C. Barrier layer 209 may be formed by any suitable technique that provides a conformal or nearly conformal layer over dielectric 201, such as physical vapor deposition (PVD), chemical vapor deposition (CVD), or atomic layer deposition (ALD). Barrier layer 209 comprises any material suitable for preventing electromigration within the interconnects, preventing oxidation of the interconnects, providing a surface for nucleation in an electroplating process, and preventing diffusion of the interconnect material into surrounding components. In an embodiment, bather layer 209 comprises tantalum, tantalum nitride, titanium, titanium nitride, ruthenium, or a combination thereof. Barrier layer 209 is of a thickness sufficient to prevent diffusion of the interconnect material, from 1-25 nm. In an embodiment, barrier layer 209 is 2 nm thick.

Interconnects 202 are formed in trenches 250 lined by bather layer 109. Interconnects 202 comprise any suitable material that can conduct current. In one embodiment, interconnects 202 are comprised of copper, aluminum, silver, or an alloy thereof. Interconnects 202 may be formed by any suitable process known in the art, such as electroplating, CVD, PVD. For example, in a damascene process copper is first blanket deposited over the entire structure via electroplating or electroless plating. Excess copper is polished away, leaving copper in the trenches to form interconnects. Interconnects 202, as shown in FIG. 2C, may be 20-100 nm wide, and 30-160 nm deep. In an embodiment, interconnects 202 are 40 nm wide and 80 nm deep. Interconnects 102 may be spaced from 16-100 nm apart. In an embodiment, interconnects 202 are spaced 40 nm apart.

A hardmask 203 is then formed over the structure surface, as shown in the embodiment illustrated in FIG. 2D. Hardmask 203 comprises any material suitable for acting as an etchstop by protecting underlying portions of the dielectric 201 and interconnects 102 during subsequent etching processes. Hardmask 203 may also comprise any material suitable to function as a barrier-type layer by preventing diffusion and electromigration of underlying interconnect material. In an embodiment of the invention, hardmask 203 comprises SiNC. Hardmask 203 is of a thickness sufficient to serve as an etch stop and also prevent diffusion of the interconnect material, from 5-20 nm thick. In an embodiment, hardmask 203 is 8 nm thick. Hardmask 203 may be formed by any suitable process, such as blanket deposition via CVD.

Next, well-known masking and etching techniques are used to define hardmask 203 on dielectric 201 where airgaps are to be formed, such as in areas where interconnects are tightly spaced and will benefit from separation by a very low k dielectric. In the specific embodiment shown in FIG. 2E, lithographic stack layers 214 are formed over hardmask 203. Lithographic stack layers 214 may comprise a carbon hardmask 210, an anti-reflective layer 211, a photoresist 212, or other lithographic materials known in the art.

In an embodiment, carbon hardmask 210 is formed over the surface of hardmask 203. Carbon hardmask 210 may be any material where the etch process used to etch the airgap is selective of the dielectric material over the carbon hardmask material, such as porous amorphous carbon. Carbon hardmask 210 has a thickness sufficient to withstand the etching process without exposing the underlying dielectric and interconnect surfaces. In an embodiment, carbon hardmask 210 is 1000 nm thick. Carbon hardmask 210 may be formed by any suitable process, such as spin-on or CVD.

Anti-reflective layer 211 is formed over the surface of carbon hardmask 210. Anti-reflective layer 211 may be any material that prevents light scattering and distortion of the lithographic pattern by absorbing the wavelength of light used for the photolithography process, such as spin on glass materials. In an embodiment, anti-reflective layer 211 is 350 nm thick.

In an embodiment, photoresist 212 is formed over anti-reflective layer 211. Photoresist 212 is patterned with well-known masking, exposing, and developing processes to define a mask with opening 230 where airgap interconnects are desired, according to the embodiment shown in FIG. 2E. Opening 230 is aligned over the portion of dielectric 201 that will be removed to form a trench where airgaps are desired, for example, between closely spaced interconnects that would benefit from improved isolation.

Next, as illustrated in FIG. 2F, anti-reflective layer 211 is etched in alignment with photoresist 212 to expose carbon hardmask 210. Anti-reflective layer 211 may be etched by any suitable technique, such as plasma etch. In FIG. 2G, carbon hardmask 210 is etched in alignment with anti-reflective layer 211 to expose hardmask 203, according to an embodiment of the invention. Carbon hardmask 210 may be etched by dry plasma etching utilizing oxygen based chemistries.

In the embodiment shown in FIG. 2H, anti-reflective layer 211, hardmask 203, and dielectric 201 are etched in alignment with opening 230 defined by carbon hardmask 210. A portion of dielectric 201 is removed to form trenches 215 between adjacent interconnects 202. The depth of trench 215 may be from 35 to 200 nm, typically proportional to the pitch of the interconnects for that layer. In an embodiment, trench 215 extends below the bottom surface of interconnects 202, as shown in FIG. 2H. In another embodiment, trench 215 extends to a depth 220 between interconnects 202, as shown by the dotted line in FIG. 2H.

Trench 215 is etched using any appropriate chemistry known in the art, such as fluorine-based chemistries. The etching process removes at least a portion of barrier layer 209 to expose at least a portion of side surface 217 of interconnect 202. Altering the etch chemistry controls the amount of barrier layer 209 that is etched. In an embodiment, an etch-dep chemistry, such as $C_xH_yF_z$, deposits a layer of polymer on the barrier layer 209 as it etches dielectric 201 to form trench 215. The polymer layer protects a portion of barrier layer 209 from the chemical component of the etch process. In an embodiment, the sputtering component of the etch process removes a portion of barrier layer 209 and may chamfer the top corners of interconnect 202, as illustrated in FIG. 2H.

According to an embodiment of the invention, the remainder of carbon hardmask 210 is then removed as illustrated by FIG. 2I. In an embodiment, carbon hardmask 210 is removed by an ashing process. In an embodiment of the invention, the underlying hardmask 203 is not removed. The structure may be cleaned to remove etch residue, including any polymer formed on the trench sidewalls, if applicable.

Next, hood layer 205 is formed to re-seal the interconnect surface after etching trench 215, as shown in FIG. 2J. In an embodiment, hood layer 205 is selectively formed on more than one surface of interconnect 202 to prevent diffusion, electromigration and oxidation of the interconnect material. In an embodiment, hood layer 205 is selectively formed on the exposed portions of top surface 216 and side surface(s) 217 of interconnect 202. In an embodiment, hood layer 205 is selectively formed by electroless plating, wherein the structure is placed in to an electroless bath. The electroless plating chemistry is selected to deposit a uniformly thick layer of hood material on the exposed interconnect surfaces, but not on the exposed surfaces of the hardmask 203, the barrier layer 209, or the dielectric 201.

Hood layer 205 may be any material capable of being electrolessly plated. Hood layer 205 may be also any material capable of preventing the diffusion and electromigration of the interconnect material. The material used for hood layer 205 may also be any material resistant to oxidation and that prevents the oxidation of underlying interconnect 202. In an embodiment of the invention, hood layer 205 is cobalt or a cobalt alloy, such as, but not limited to, cobalt tungsten alloy, cobalt tungsten phosphide, or cobalt boron phosphide. Hood layer 205 is of a uniform thickness sufficient to prevent diffusion and electromigration of interconnect material, but thin enough to not unduly increase the resistance of interconnect 202. In an embodiment, hood layer 205 is thicker than barrier layer 209. Hood layer 205 may be from 5-15 nm thick. In an embodiment, hood layer 205 is 10 nm thick.

Next, a gap-sealing dielectric layer 207 is blanket deposited on the top surfaces of hardmask 203 and hood layer 205, sealing airgap 204 as shown in FIG. 2K. Gap-sealing dielectric layer 207 may be comprised of any material that can be non-conformally formed on the surface of the structure, such that the material pinches off above trench 215. In an embodiment of the invention, gap-sealing dielectric layer 207 comprises silicon dioxide. In alternative embodiments, gap-sealing dielectric layer 207 comprises silicon nitride, a silicate, carbon doped oxide, fluorine doped oxide, porous dielectric materials, and the like. Gap-sealing dielectric layer 207 may be 80 to 300 nm thick. In an embodiment, gap-sealing dielectric layer 207 is 160 nm thick. Gap-sealing dielectric layer 207 may be formed by any method known in the art that is sufficient to form a dielectric layer without filling the trench, such as CVD.

A sacrificial light absorbing material (SLAM) layer 213 is optionally formed over gap-sealing dielectric layer 207 in order to planarize the surface of the structure, according to an embodiment of the invention shown in FIG. 2L. SLAM layer 213 and a portion of gap-sealing dielectric layer 207 are subject to a blanket etch as illustrated by FIG. 2M. Any etch process known in the art that is sufficient to planarize the structure surface may be used, such as, but not limited to, a non-selective dry etch process.

A bulk ILD 208 may be formed over gap-sealing dielectric 207, as needed to electrically isolate device layers located above or below the layer illustrated. Bulk ILD 208 may be formed from any material suitable to mitigate cross-talk between interconnects 202 and subsequently formed device layers. In an embodiment of the invention, bulk ILD 208 is silicon dioxide. In an alternative embodiment, bulk ILD 208 comprises silicon dioxide, silicon nitride, a silicate, carbon doped oxide, fluorine doped oxide, porous dielectric materials, and the like. Bulk ILD 208 may be formed by any suitable method, such as CVD.

Figure 3A:
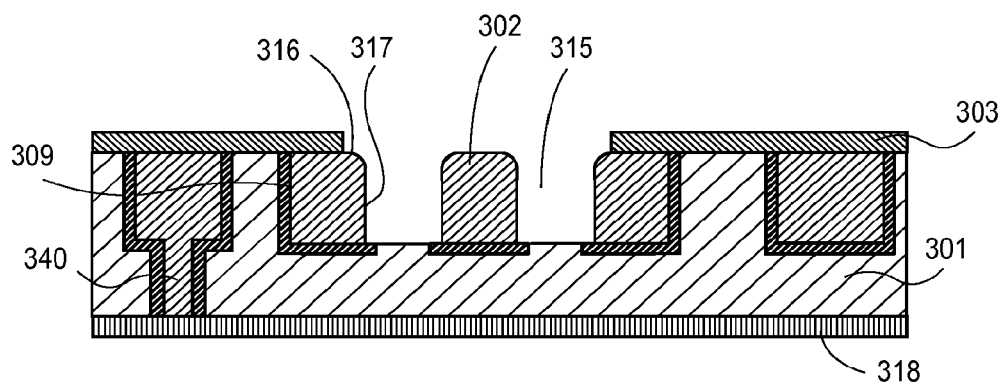
FIG. 3A illustrates a cross-sectional view of a trench between two interconnects, wherein the barrier layer has been completely removed from the interconnect sidewall adjacent to the trench, according to an embodiment of the invention.
Figure 3B:
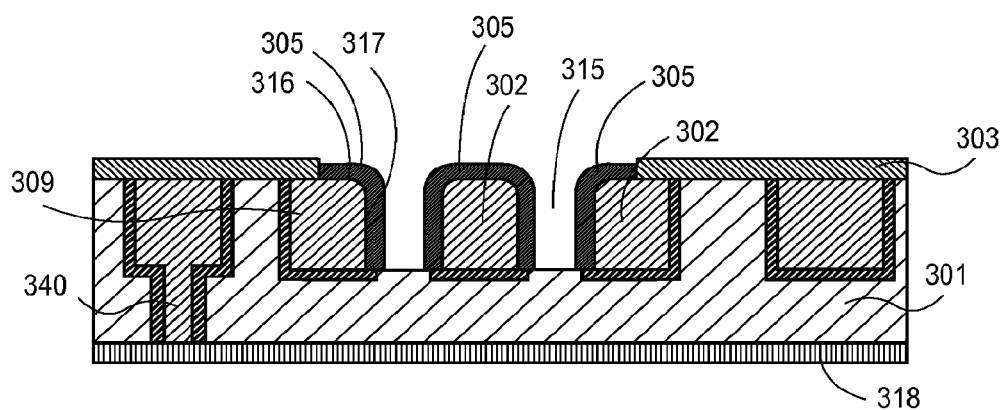
FIG. 3B illustrates a cross-sectional view of a hood layer formed on an interconnect, wherein the hood layer covers the entire side of the adjacent interconnects, according to an embodiment of the invention.
Figure 3C:
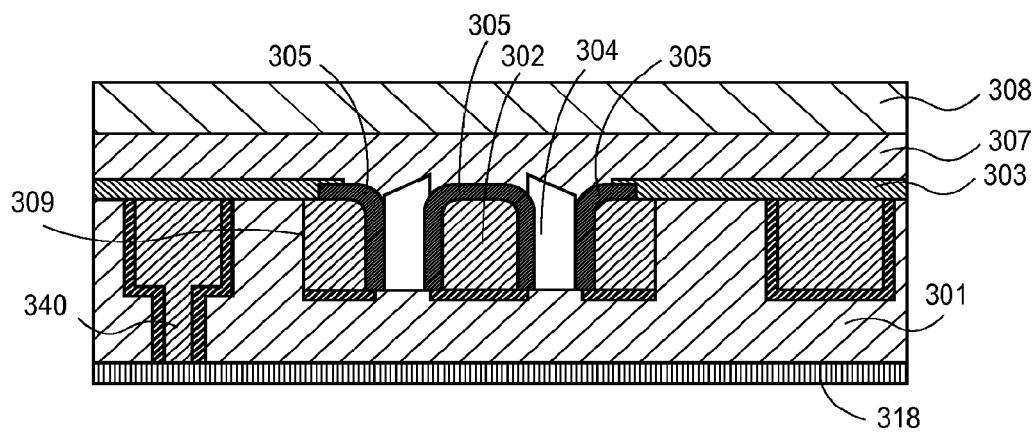
FIG. 3C illustrates a cross-sectional view of the hood layer shown in FIG. 3B with additional layers added to enclose the airgaps between adjacent interconnects, according to an embodiment of the invention.

In another embodiment of the invention illustrated by FIGS. 3A-C, hood layer 305 is formed on the entire side surface 317 of interconnect 302. FIG. 3A illustrates a structure prepared, for example, by the process described above with respect to FIGS. 2A-2I, comprising substrate 318, dielectric 301, hardmask 303 and interconnects 302, which may have vias 340. In the embodiment shown in FIG. 3A, trenches 315 have been etched using an etch process and etch chemistry that removes all or substantially all of barrier layer 309 from side surfaces 317. Trenches 315 may be etched by, for example, a fluorine-based etch such as $NF_3$, which does not form a protective polymer layer on etched surfaces, and therefore may etch barrier layer 309 completely or nearly completely, exposing the underlying side surface 317 of interconnect 302. In an embodiment, the sputtering component of the etch process may chamfer the top corners of interconnect 302 that are adjacent to trench 315, as shown in FIG. 3A.

Next, hood layer 105 is selectively deposited on a portion of top surface 316 and all of side surface 317, as shown in FIG. 3B. In an embodiment, hood layer 305 is deposited using electroless plating, as described above with respect to FIG. 2J. In the embodiment shown in FIG. 3C, airgap 305 is sealed by gap-sealing dielectric layer 307, formed as described above with respect to FIG. 2K. Bulk ILD 308 may be formed on gap-sealing dielectric layer 307 as described above with respect to FIGS. 2L-2N.

Figure 4A:
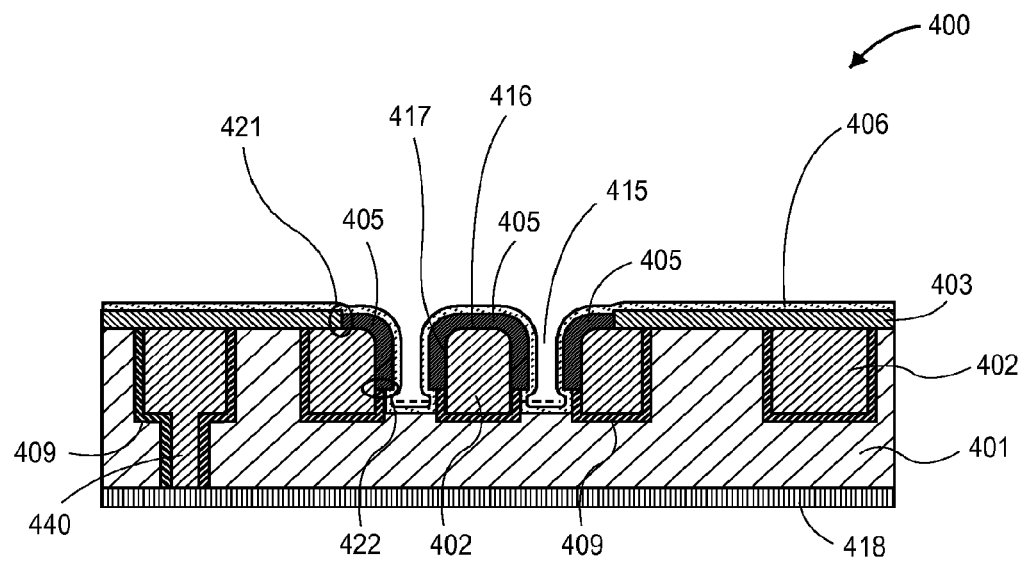
FIG. 4A illustrates a cross-sectional view of a conformal liner layer formed over a hood layer and within an airgap, according to an embodiment of the invention.
Figure 4B:
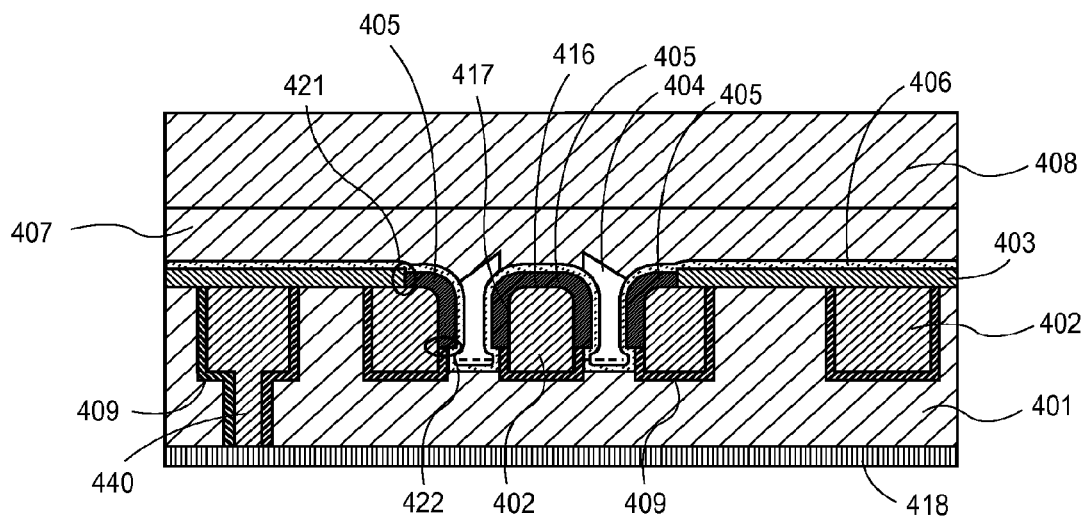
FIG. 4B illustrates a cross-sectional view of additional dielectric layers formed over airgap interconnects having a hood layer and a conformal liner layer, according to an embodiment of the invention.

FIGS. 4A-4B illustrate another embodiment of the invention, wherein conformal liner layer 406 is conformally deposited over the structure surface and within trench 415 to protect against diffusion of interconnect material through hardmask/hood layer interface 421 and through hood layer/barrier layer interface 422, as described above with respect to FIG. 1B. In FIG. 4A, a conformal liner layer is deposited over a structure formed, for example, as described with respect to FIGS. 2A-2J above, and comprising substrate 418, dielectric 401, hardmask 403 and interconnects 402, which may have vias 440. Conformal liner layer 406 may be formed by any suitable technique that produces a layer that is conformal, or nearly conformal, with the exposed surfaces of structure 400, such as ALD or CVD.

Next, gap-sealing layer 407 and bulk ILD 408 may be formed over conformal liner layer 406, as shown in FIG. 4B. Gap-sealing dielectric layer 407 seals the top of the trench defined by conformal liner layer 406 to form airgap 404, according to an embodiment of the invention. The materials and processes for forming gap-sealing dielectric layer 407 and bulk ILD 408 are as discussed above with respect to FIGS. 1A-1B and 2K-2N.

Figure 5:
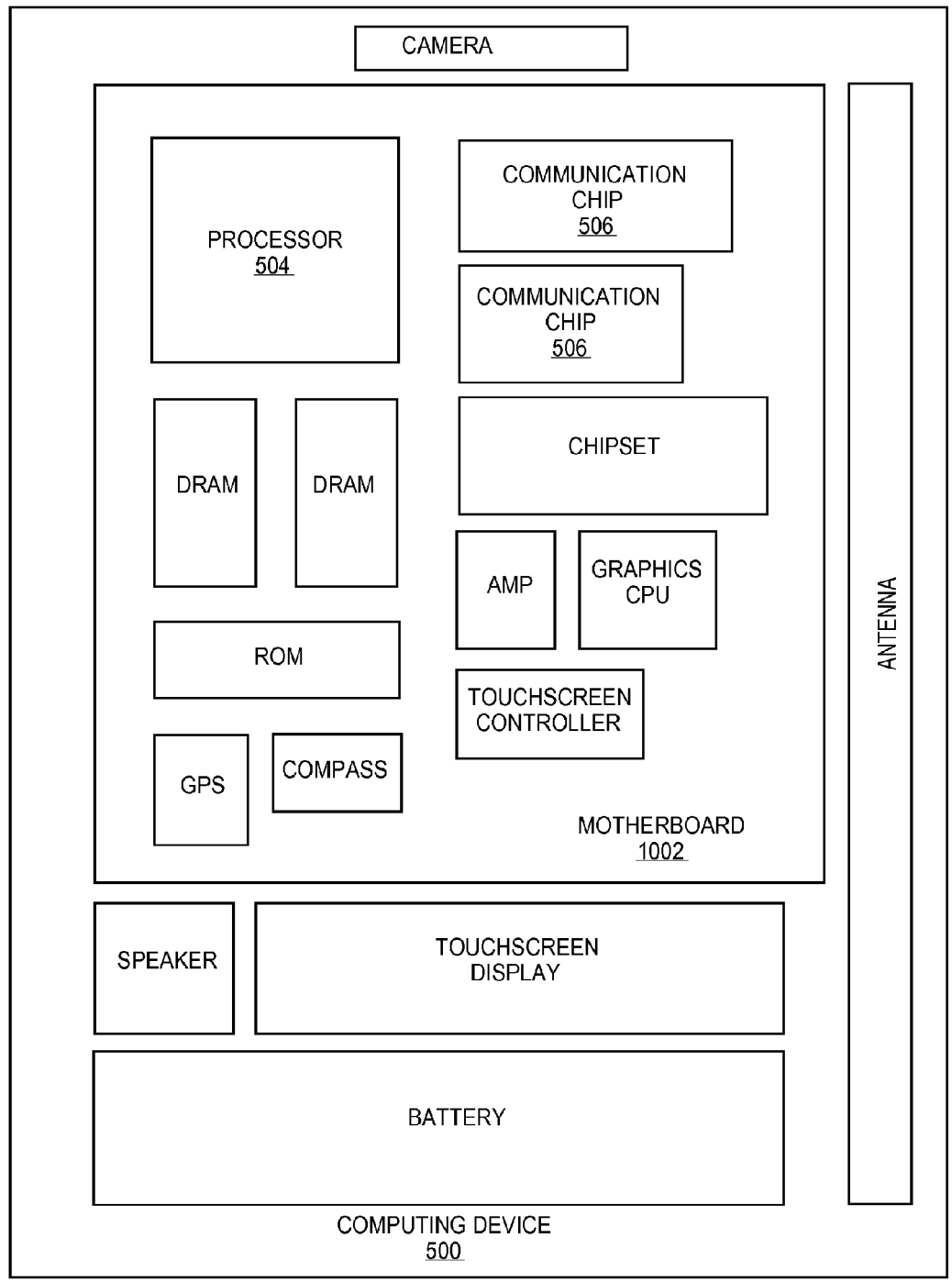
FIG. 5 illustrates a computing device in accordance with one embodiment of the invention.

FIG. 5 illustrates a computing device 500 in accordance with one implementation of the invention. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

Depending on its applications, computing device 500 may include other components that may or may not be physically and electrically coupled to the board 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some implementations of the invention, the integrated circuit die of the processor includes one or more airgap interconnects with hood layers in accordance with implementations of the invention. The term "processor" may refer to any device or portion of a device that processes electronic data from registers and/or memory to transform that electronic data into other electronic data that may be stored in registers and/or memory.

The communication chip 506 also includes an integrated circuit die packaged within the communication chip 506. In accordance with another implementation of the invention, the integrated circuit die of the communication chip includes one or more airgap interconnects with hood layers in accordance with implementations of the invention.

In further implementations, another component housed within the computing device 500 may contain an integrated circuit die that includes one or more airgap interconnects with hood layers in accordance with implementations of the invention.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

What is claimed is:

1. A semiconductor device comprising:
   a substrate having a dielectric layer with a plurality of interconnects formed therein, wherein each interconnect has a top surface and a side surface;
   an airgap located between adjacent interconnects; and
   a plurality of conductive hood layers, wherein each hood layer contacts at least a portion of each of the top surface and the side surface of a corresponding one of the adjacent interconnects.

2. The semiconductor device of claim 1, wherein the conductive hood layer is selected from the group consisting of Co and Co alloys.

3. The semiconductor device of claim 1, wherein the conductive hood layer is 5-15 nm thick.

4. The semiconductor device of claim 1, wherein the adjacent interconnects are copper.

5. The semiconductor device of claim 1, further comprising a gap-sealing dielectric layer above the hood layer, wherein the gap-sealing dielectric layer seals the airgap.

6. The semiconductor device of claim 1, further comprising a barrier layer covering a portion of the side surface of each interconnect.

7. The semiconductor device of claim 6, wherein the barrier layer is selected from the group consisting of tantalum, tantalum nitride, titanium, titanium nitride, and ruthenium.

8. The semiconductor device of claim 1, further comprising a conformal liner layer, wherein the conformal liner layer conforms to the top surface of the conductive hood layer, the interface between the conductive hood layer and the airgap, and the interface between the airgap and the dielectric layer.

9. A method for forming a semiconductor device comprising:
   providing a substrate having a dielectric layer with a plurality of interconnects formed therein, wherein each interconnect has a top surface and a side surface;
   forming a hardmask on the dielectric layer and patterning the hardmask to expose a surface of the dielectric layer between adjacent interconnects;
   etching the dielectric layer between the two adjacent interconnects to form a trench, wherein the etching process exposes at least a portion of the side surface of each adjacent interconnect; and
   electrolessly plating a hood layer onto the exposed portion of the top surface and the exposed portion of each side surface.

10. The method of claim 9, wherein the trench is etched to a depth below the bottom edge of the adjacent interconnects.

11. The method of claim 9, wherein the trench is etched to a depth above the bottom edge of the adjacent interconnects.

12. The method of claim 9, wherein the hood layer is selected from the group consisting of Co and Co alloys.

13. The method of claim 9, wherein the hood layer is 5-15 nm thick.

14. The method of claim 9, wherein the adjacent interconnects are copper.

15. The method of claim 9, further comprising: forming a barrier layer on the side surface; and etching at least a portion of the bather layer to expose the side surface.

16. The method of claim 15, wherein the barrier layer is selected from the group consisting of tantalum, tantalum nitride, titanium, titanium nitride, and ruthenium.

17. The method of claim 9, further comprising forming a gap-sealing dielectric layer above the trench, wherein the gap-sealing dielectric layer seals the trench to form an airgap.

18. The method of claim 9, further comprising forming a conformal liner layer, wherein the conformal liner layer conforms to the top surface of the hood layer and the edges of the trench.

19. A method for forming a semiconductor device, comprising:

providing a substrate having a dielectric layer with a plurality of copper interconnects formed therein, wherein each copper interconnect has a top surface and a side surface, and wherein the side surface is covered by a barrier layer;

forming a hardmask on the dielectric layer;

patterning the hardmask to expose a portion of a surface of the dielectric layer between adjacent copper interconnects;

etching the dielectric layer between the adjacent copper interconnects to form a trench, wherein the etching process etches at least a portion of the barrier layer to expose a portion of the side surface of each adjacent copper interconnect;

electrolessly plating a cobalt hood layer onto an exposed portion of the top surface and the exposed portion of each side surface;

forming a gap-sealing dielectric layer over the hardmask, the cobalt hood layer and the trench, wherein the gap-sealing dielectric layer seals the trench to form an airgap.

* * * * *